US007250709B2

(12) United States Patent
Flaemig-Vetter et al.

(10) Patent No.: US 7,250,709 B2
(45) Date of Patent: Jul. 31, 2007

(54) PIEZOELECTRIC ACTUATOR FOR MEDIA FLOWING THEREAROUND AND USE OF A CORRESPONDING PIEZOELECTRIC ACTUATOR

(75) Inventors: Tobias Flaemig-Vetter, Esslingen (DE); Heinz Oeing, Fellbach (DE); Gregor Renner, Stuttgart (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 10/520,172

(22) PCT Filed: Jun. 6, 2003

(86) PCT No.: PCT/EP03/05964

§ 371 (c)(1),
(2), (4) Date: Aug. 23, 2005

(87) PCT Pub. No.: WO2004/006348

PCT Pub. Date: Jan. 15, 2004

(65) Prior Publication Data

US 2006/0087202 A1 Apr. 27, 2006

(30) Foreign Application Priority Data

Jul. 4, 2002 (DE) ................................. 102 30 032

(51) Int. Cl.
*H01L 41/08* (2006.01)
(52) U.S. Cl. ...................................... 310/340; 310/328
(58) Field of Classification Search ................ 310/328, 310/340, 366
See application file for complete search history.

(56) References Cited

U.S. PATENT DOCUMENTS

| | | | | |
|---|---|---|---|---|
| 4,553,059 A | * | 11/1985 | Abe et al. | 310/328 |
| 5,113,108 A | * | 5/1992 | Yamashita et al. | 310/328 |
| 5,239,223 A | * | 8/1993 | Miyoshi | 310/328 |
| 5,250,868 A | * | 10/1993 | Shirasu | 310/328 |
| 6,333,587 B1 | * | 12/2001 | Heinz et al. | 310/328 |
| 6,452,308 B1 | * | 9/2002 | Heinz et al. | 310/328 |
| 6,552,472 B1 | * | 4/2003 | Heinz | 310/328 |
| 6,700,308 B2 | * | 3/2004 | Heinz | 310/328 |

FOREIGN PATENT DOCUMENTS

| | | |
|---|---|---|
| DE | 39 32 966 C | 4/1991 |
| DE | 196 42 653 C1 | 1/1998 |
| DE | 198 18 068 A | 10/1999 |

* cited by examiner

*Primary Examiner*—Mark Budd
(74) *Attorney, Agent, or Firm*—Crowell & Moring LLP

(57) ABSTRACT

A piezoelectric actuator for media flowing around it having a piezo stack which is arranged within a deformable isolating material so as to be in direct contact therewith at least over certain regions. The isolating material is for its part enclosed by a fluidically closed actuator housing, which is formed by a housing shell which is delimited at its one end by a dimensionally stable actuator top and at its other end by a dimensionally stable actuator bottom. The actuator top and bottom are arranged on the active main surfaces of the piezo stack. To increase the service life, the housing shell is produced from a limp and/or elastic material and is disposed at a distance from the piezo stack. The length of the housing shell, measured along the surface line, corresponds at least to the maximum extent of the piezo stack and/or the housing shell can be stretched accordingly.

19 Claims, 4 Drawing Sheets

PIEZOELECTRIC ACTUATOR FOR MEDIA FLOWING THEREAROUND AND USE OF A CORRESPONDING PIEZOELECTRIC ACTUATOR

The application claims the priority of German Patent Document No. 102 30 32.1, filed 4 Jul. 2002 and PCT/EP2003/005964, filed 6 Jun. 2003 the disclosure of which is expressly incorporated by reference herein, respectively.

BACKGROUND AND SUMMARY OF THE INVENTION

The invention relates to a piezoelectric actuator for media flowing therearound, as disclosed for example by the generically determinative German application DE 198 18 068 A1, and uses of the same.

The generically determinative German application DE 198 18 068 A1 discloses a piezoelectric actuator for media flowing therearound which comprises a piezo stack which is arranged within a deformable isolating material so as to be in direct contact therewith. The isolating material is enclosed by an actuator housing. The actuator housing is formed by a housing shell, which is connected at one end to a dimensionally stable actuator top and at the other end to a dimensionally stable actuator bottom. The actuator top and the actuator bottom are connected to the active main surfaces of the piezo stack. The electrical connecting lines of the piezo stack are led through the actuator top. Furthermore, it is conceivable to lead the actuator connections of the piezo stack up to the end plates (actuator top or actuator bottom) of the actuator and to use one or both end plates as electrical contact surfaces.

Since the electrically insulating isolating material is formed from an elastic plastic, for example silicone, which bears directly against the outer surface of the piezo stack, it must follow the very rapid movement of the piezo stack in use. As a result, there is the risk of cracks forming in the isolating material and the isolating material becoming detached, so that the medium flowing around can get into the piezo stack in a destructive way.

The object of the invention is to increase the service life of such actuators for media flowing therearound.

The object is achieved by forming the housing shell from a limp and/or elastic material, in order that the hermetic separating layer is moved away from the highly active surface of the piezo stack. This reduces the effect of wear between the piezo stack, comprising a piezoelectric ceramic, and the isolating material. This is achieved furthermore by simple structural operations, so that it is possible to dispense with complex sealing arrangements.

An actuator according to the invention permits a free change in length of the actuator, or of the piezo stack, with the effect of at least reducing the probability of the piezo stack being wetted by a particularly aggressive medium flowing therearound, preferably a pressurized fuel.

The housing shell is disposed at a distance from the piezo stack at all points. Furthermore, the length of the housing shell, measured along the surface line, corresponds at least to the maximum extent of the actuator and/or the housing shell can at least be stretched accordingly, in order that the extent of the piezo stack can be accepted by the housing shell.

Since the isolating material is preferably formed largely by an incompressible medium, its dimensional change, for example the formation of a constriction in the extent of the piezo stack, can be taken into account in the dimensioning of the length of the housing shell, in particular in the direction of the extent of the piezo stack.

Furthermore, an electrically insulating fluid, in particular a liquid, and/or a gel is introduced between the housing shell and the piezo stack. The isolating material, in particular a silicone oil, at least largely fills the inside volume of the actuator housing. In this way, the inside volume of the actuator housing is at least largely free from a compressible gas.

In the case of the claimed construction, only the fluidic isolating material has contact with the piezo stack. Therefore, any shearing forces that may occur are small, thereby increasing the service life of the actuator. Against this background, it is also an advantage that, if the isolating material has good to high thermal conductivity, any frictional heat occurring between the piezo stack and the material is removed.

The same applies to the removal of heat from the piezo stack, for which reason the thermal conductivity of the isolating material is preferably equal to or greater than that of the material of the piezo stack.

The same advantage applies to the thermal conductivity of the two end plates (actuator top and actuator bottom), whereby the dissipation of the heat occurring in active operation to the medium flowing around is facilitated and/or improved.

Since the media flowing around the actuator, in particular fuel for the operation of an internal combustion engine, may well have a chemically or in some other way aggressive character, material which is at least largely resistant to these expected stresses is expediently chosen as the material of the housing shell.

In a favorable way, the viscosity of the isolating medium corresponds approximately to that of the medium flowing around, since the loading of the material of the housing shell by the medium flowing therearound is further reduced as a result.

In particular when using actuators of which the end plate(s) is/are used as electrical contacts, the material of the housing shell is appropriately an electrically insulating material.

Depending on the application, for example in hydraulics, it is favorable to form the actuator top with a different cross-sectional area than the actuator bottom. In a further refinement, the actuator top and/or the actuator bottom has a cross-sectional area which is adapted to the respective conditions in use.

A preferred use of actuators according to the invention is in and/or as an injection valve, in particular of an internal combustion engine, preferably in a gasoline or diesel engine. Furthermore, such an actuator may also be used for a proportional valve and/or for a sonotrode.

BRIEF DESCRIPTION OF THE DRAWINGS

The invention is explained in more detail on the basis of exemplary embodiments that are represented in the figures, in which.

DETAILED DESCRIPTION OF THE DRAWINGS

Figure 1:
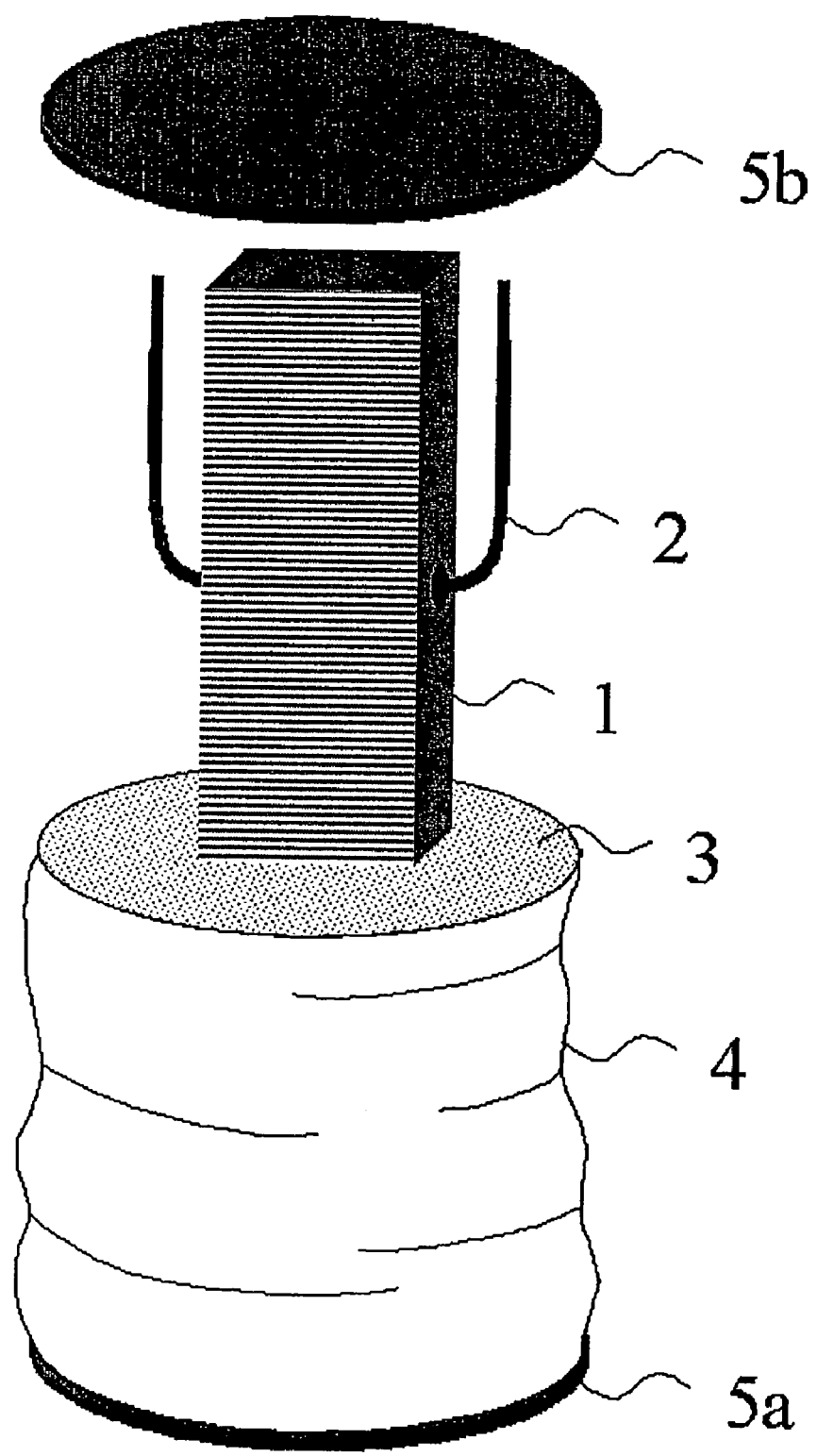
FIG. 1 shows an exploded representation of an actuator.

In FIG. 1, an exploded drawing of an actuator according to the invention is represented. The actuator has inside it a centrally arranged piezo stack 1 comprising a number of layers of piezo sheets of a piezoelectric ceramic.

The piezo stack 1 is surrounded by an electrically insulating isolating material 3, in particular a silicone oil. The isolating material 3 is surrounded on the outside by a housing shell 4, which is sealed with respect to the isolating material 3.

Arranged preferably equidistant from each other on the active main surfaces of the piezo stack 1, there is on the one hand a dimensionally stable actuator top 5b and on the other hand a dimensionally stable actuator bottom 5a.

The actuator bottom 5a and the actuator top 5b are both connected in a sealing manner to the housing shell 4, with respect to the isolating material 3 and with respect to the medium flowing around. The actuator bottom 5a, the actuator top 5b and the housing shell 4 together form an actuator housing which is sealed at least with respect to the isolating material 3 and the medium flowing around.

Electrical connecting lines 2, which lead to the actuator 5b, are both connected to regions of the actuator top 5b in such a way that they are electrically conducting but nevertheless insulating with respect to each other. One of the connecting lines 2 is respectively connected to unipolar regions of the piezo sheets. They serve for supplying voltage and for controlling the extent of the piezo stack 1. In this way, the corresponding regions of the actuator top 5b that are connected to these connecting lines 2 represent contact surfaces for the electrical control of the actuator.

In the present exemplary embodiment, the housing shell 4 consists of a limp, preferably tear-resistant material. It is disposed at a, not necessarily constant, distance from the piezo stack 1 at all points.

Figure 2:
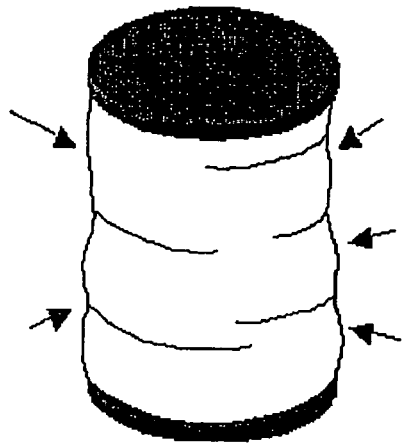
FIG. 2 shows an actuator as shown in FIG. 1, arranged in a medium and in the relaxed state.
Figure 3:
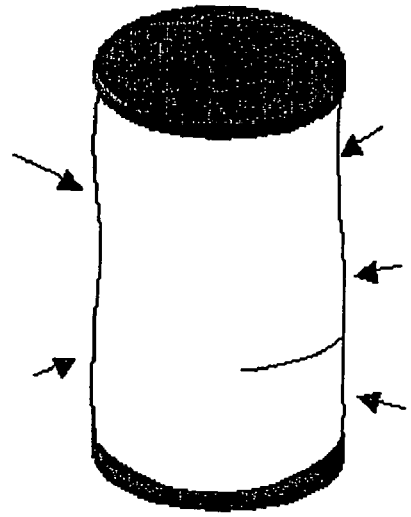
FIG. 3 shows the actuator as shown in FIG. 1 in the completely extended state.

In FIGS. 2 and 3, the actuator shown in FIG. 1 is represented in a fuel for internal combustion engines, preferably gasoline or diesel engines, which is flowing around it and under pressure (see arrows). In the moved-together state, the housing shell 4, made of limp material, is of a form which is irregular and pushed-together or pressed-together axially (along the main direction of extent of the piezo stack 1) and radially (see FIG. 2). When the piezo stack 1 is fully extended (see FIG. 3), the housing shell 4 is stretched and approximates a straight line.

As can be seen, the minimum height of the housing shell 4, measured along the surface line, corresponds at least to the corresponding maximum extent of the actuator. The minimum height also include compensation for the deformation of the isolating material 3, as may occur at least when the piezo stack extends.

Figure 7:
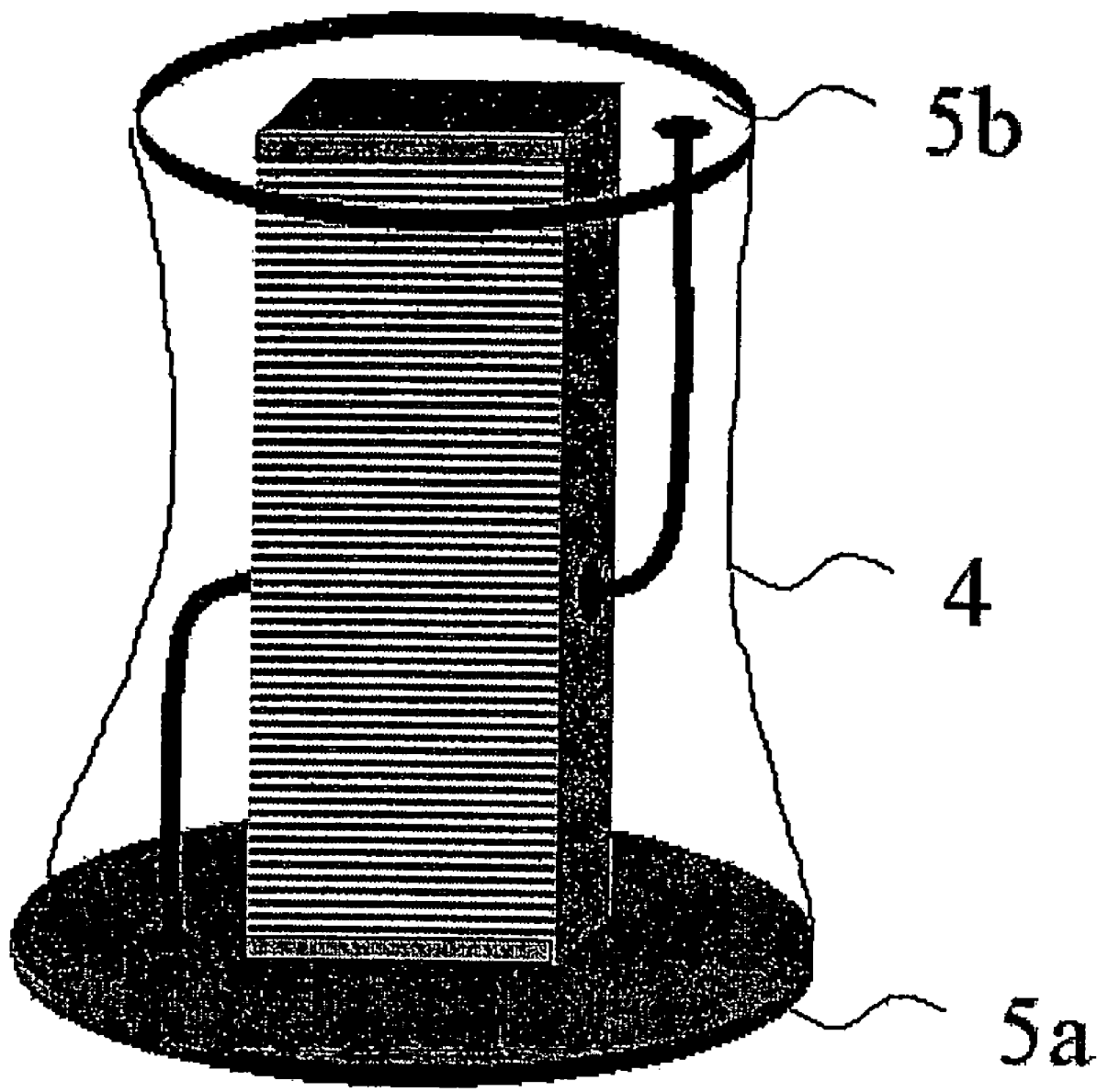

The deformation of the liquid and/or gel-like isolating material 3, preferably a silicone oil, is based on the incompressibility of fluids. Since the volume of an incompressible isolating material 3 remains the same when the piezo stack 1 extends, it must change its shape. This may take place for example—as represented in FIG. 7—in a constricted manner from one cylindrical shape to another cylindrical.

It follows that the minimum length of the shell is usually somewhat greater than the distance between the two end plates 5 when the piezo stack 1 is completely extended (see FIGS. 2 and 3). In the case of a purely limp and inelastic material, the compensation should already be taken into account in the dimensioning of the length for the housing shell. In the case of an elastic material, the compensating length and/or the displacement of the piezo stack 1 can be applied in particular just by the elasticity of the material.

Figure 4:
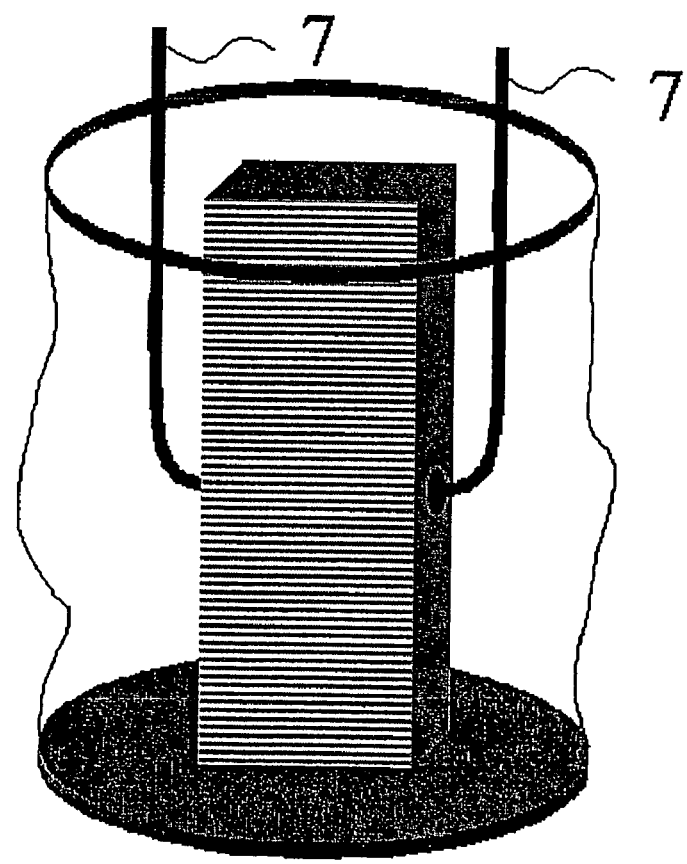
FIG. 4 shows an actuator with opened actuator top and electrical lines led out from the actuator housing on one side.

The exemplary embodiment according to FIG. 4 is identical in large parts to that shown in the previous figures. The representation is shown however without the actuator top 5b and without isolating fluid. In the case of this exemplary embodiment, however, the control lines 7 are led to the outside through the actuator top 5b—not depicted—and electrically insulated from one another.

Figure 5:
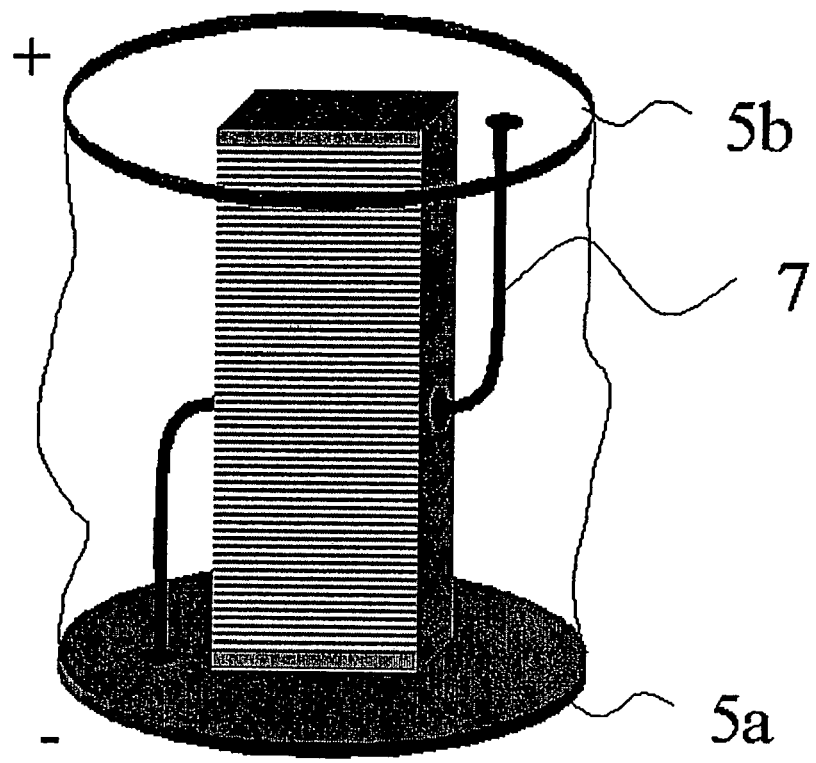
FIG. 5 shows an actuator with electrical lines arranged on both end plates.

In the exemplary embodiment as shown in FIG. 5, on the other hand, one connecting line is connected in an electrically conducting manner to the actuator bottom 5a and the other to the actuator top 5b. In particular in this case, the housing shell 4 should be produced from an electrically insulating material.

Figure 6:
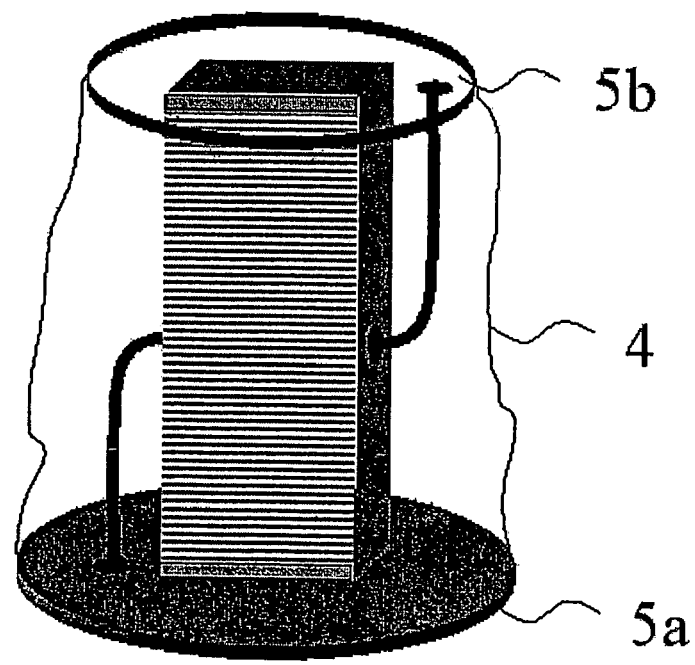
FIG. 6 shows an actuator with different end plates and elastic material for the housing shell and FIG. 7 shows the actuator as shown in FIG. 6 with an extended piezo stack.

Represented in FIGS. 6 and 7 are actuators of which the actuator bottom 5a and actuator top 5b have a different cross section. At the same time, the end plates serve as electrical connections for the piezo stack 1. The housing shell 4 is produced from a material which is electrically insulating and elastic. In the relaxed state (stress equals zero) of the piezo stack 1, the length of the housing shell is greater than the distance between the two end plates 5 connected to them in a sealing manner, so that the housing shell gives a limp impression.

In the fully extended state of the piezo stack 1 (see FIG. 5), the surface line of the housing shell 4 does not run in a straight line between the two end plates 5 but as a constriction, for the reasons stated above.

With the present elastic material of the housing shell 4, which is additionally also limply fitted, in the case of this exemplary embodiment the compensating length is applied by the greater length of the shell in comparison with the drawn-together position of the piezo stack 1 and also by the elasticity of the material of the housing shell 4.

The invention claimed is:

1. A piezoelectric actuator for insertion in a flowing media, comprising:
a piezo stack having a top active main surface and a bottom active main surface;
deformable isolating material in direct contact with at least portions of said piezo stack;
actuator housing enclosing said isolating material, said housing having a non-rigid housing shell and a dimensionally stable actuator top arranged on the top active main surface of the piezo stack and dimensionally stable actuator bottom arranged on said bottom active main surface of the piezo stack;
electrical connection lines extending from said piezo stack through said actuator housing by means of at least one of said dimensionally stable actuator top and actuator bottom wherein said housing shell is disposed at a distance from piezo stack at all pointer, and a length of the housing shell, when measured along a surface line, corresponds to at least a maximum extend of the piezo stack or the housing shell is able to be stretched to the maximum extent of the piezo stack, wherein the isolating material is one of an electrically insulating fluid and gel, wherein an inside volume of the housing is substantially filled with said isolating material, and wherein the housing shell and the dimensionally stable actuator bottom and the dimensionally stable actuator top are connected to each other in a sealed manner with respect to the isolating material and the flowing media.

2. The piezoelectric actuator as claimed in claim 1, wherein the piezo stack comprises piezoelectric ceramic.

3. The piezoelectric actuator as claimed in claim 1, wherein the actuator top and the actuator bottom are arranged equidistant from each other.

4. The piezoelectric actuator as claimed in claim 1, wherein the material of the housing shell is at least largely resistant to the media flowing around it.

5. The piezoelectric actuator as claimed in claim 1, wherein an inside volume of the actuator housing is substantially gas-free.

6. The piezoelectric actuator as claimed in claim 1, wherein viscosity of the isolating medium corresponds approximately to viscosity of the flowing media.

7. The piezoelectric actuator as claimed in claim 1, wherein the material of the housing shell is electrically neutral.

8. The piezoelectric actuator as claimed in claim 1, wherein the actuator top and the actuator bottom have a different cross-sectional area.

9. The piezoelectric actuator as claimed in claim 1, wherein the isolating material is a silicone oil.

10. The piezoelectric actuator as claimed in claim 1, wherein thermal conductivity of the isolating material is equal to or greater than thermal conductivity of the material of the piezo stack.

11. The piezoelectric actuator as claimed in claim 1, wherein at least one of the actuator top and the actuator bottom have a cross-sectional area which respectively corresponds to the assigned active surface of the piezo stack, arranged transversely to the main direction of extent of the piezo stack.

12. The piezoelectric actuator as claimed in claim 1, wherein at least one of the actuator top and the actuator bottom have at least two terminating regions, electrically insulated from each other, for the electrical connecting lines of the piezo stack.

13. The use of a piezoelectric actuator as claimed in claim 1 for an injection valve of an internal combustion engine.

14. The use of a piezoelectric actuator as claimed in claim 1 for a proportional valve.

15. The use of a piezoelectric actuator as claimed in claim 1 for a sonotrode.

16. The piezoelectric actuator as claimed in claim 5, wherein the media is fuel.

17. The piezoelectric actuator as claimed in claim 13, wherein the internal combustion engine is one of a gasoline and diesel engine.

18. The piezoelectric activator as claimed in claim 1, wherein the material of the housing shell is at least largely resistant to the media flowing there around, an inside volume of the actuator housing is substantially gas-free, viscosity of the isolating medium corresponds approximately to the flowing media, the housing shell material is electrically neutral, and thermal conductivity of the isolating material is at least equal to that of the piezo stack material.

19. The piezoelectric actuator as claimed in claim 1, wherein the non-rigid shell is fabricated from a limp or elastic material.

* * * * *